United States Patent
Yun et al.

(10) Patent No.: US 10,797,682 B2
(45) Date of Patent: Oct. 6, 2020

(54) COMMON SIGNAL ATTENUATION CIRCUIT AND RAMP SIGNAL GENERATOR USING THE SAME

(71) Applicant: SK hynix Inc., Gyeonggi-do (KR)

(72) Inventors: Gun-Hee Yun, Gyeonggi-do (KR); Hyun-Mook Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/680,848

(22) Filed: Aug. 18, 2017

(65) Prior Publication Data

US 2018/0183408 A1 Jun. 28, 2018

(30) Foreign Application Priority Data

Dec. 26, 2016 (KR) .......................... 10-2016-0179283

(51) Int. Cl.
*H03H 11/24* (2006.01)
*H03K 3/013* (2006.01)
*H03K 5/003* (2006.01)

(52) U.S. Cl.
CPC ........... *H03H 11/245* (2013.01); *H03K 3/013* (2013.01); *H03K 5/003* (2013.01)

(58) Field of Classification Search
CPC .............................. H03H 11/245; H03K 3/013
USPC ................................................. 327/132, 140
See application file for complete search history.

(56) References Cited

U.S. PATENT DOCUMENTS

| 7,348,812 B2 * | 3/2008 | Ikezawa | H02M 1/088 323/284 |
| 2015/0295563 A1 * | 10/2015 | Kim | H03K 3/013 327/543 |
| 2016/0014363 A1 * | 1/2016 | Kito | H04N 5/378 348/308 |

FOREIGN PATENT DOCUMENTS

| KR | 100695064 | 3/2007 |
| KR | 1020150082900 | 7/2015 |

* cited by examiner

*Primary Examiner* — Lincoln D Donovan
*Assistant Examiner* — Colleen J O Toole
(74) *Attorney, Agent, or Firm* — IP & T Group LLP

(57) ABSTRACT

A common signal attenuation circuit may include a sensing block suitable for sensing differential signals to generate sensed differential signals; a common signal generation block suitable for generating an common signal having a common voltage noise by combining the sensed differential signals; and an attenuation block suitable for adjusting the common voltage noise in the original common signal by combining the common signal having the adjusted common voltage noise to the differential signals.

16 Claims, 4 Drawing Sheets

COMMON SIGNAL ATTENUATION CIRCUIT AND RAMP SIGNAL GENERATOR USING THE SAME

CROSS-REFERENCE TO RELATED APPLICATION

This application claims priority under 35 U.S.C. § 119 to Korean Patent Application No. 10-2016-0179283 filed on Dec. 26, 2016 in the Korean Intellectual Property Office, the disclosure of which is incorporated herein by reference in its entirety.

TECHNICAL FIELD

Exemplary embodiments of the present disclosure relate to a common signal attenuation circuit and a ramp signal generator using the same, and more particularly, to a common signal attenuation circuit capable of attenuating a common signal included in differential signals and a ramp signal generator using the same.

DISCUSSION OF THE RELATED ART

Generally, an imaging system such as, for example, a complementary metal oxide semiconductor (CMOS) image sensor may include a ramp signal generator in order to generate an image signal. The ramp signal generator may include a common signal attenuation circuit which includes, for example, a differential signal generator generates and outputs two differential signals having signal phases opposite to each other. However, the differential signals include a common signal (common voltage) such as common voltage noise which is caused in common.

Therefore, a conventional common signal attenuation circuit uses an amplifier having a differential input/output function to reduce the common signal such as common voltage noise which is present in common in the differential signals.

However, the amplifier increases the size and power consumption of the conventional common signal attenuation circuit.

SUMMARY

Various embodiments are directed to an improved common signal attenuation circuit for attenuating a common signal in differential signals, and a ramp signal generator using the same.

In an embodiment, a common signal attenuation circuit may include a sensing block suitable for sensing differential signals to generate sensed differential signals; a common signal generation block suitable for generating an common signal having a common voltage noise by combining the sensed differential signals; and an attenuation block suitable for adjusting the common voltage noise in the original common signal by combining the common signal having the adjusted common voltage noise to the differential signals.

In an embodiment, a ramp signal generator may include a ramp signal generation block suitable for generating two ramp signals having opposite signal phases and including a common voltage nose; a common signal attenuation circuit suitable for generating a common signal having the common voltage noise from the ramp signals and attenuating the common voltage noise in the common signal based on the two ramp signals; and a resistive load block suitable for converting the ramp signals including the attenuated common voltage noise into voltage-type ramp signals.

DETAILED DESCRIPTION

Figure 1A:
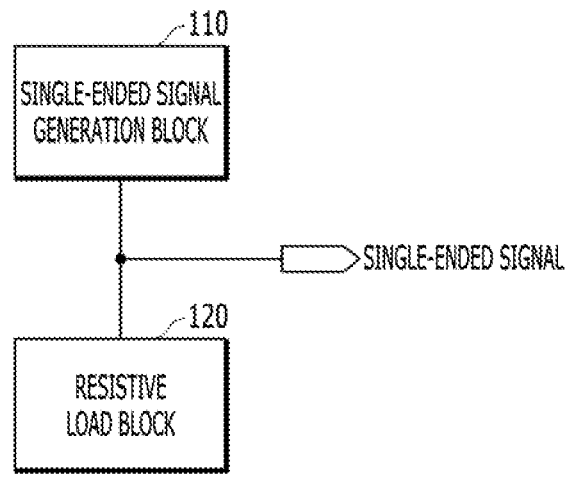
FIG. 1A is a diagram illustrating a conventional single-ended signal generator.

Various embodiments will be described below in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Throughout the disclosure, like reference numerals refer to like parts throughout the various figures and embodiments of the present disclosure.

It will be understood that when an element is referred to as being "coupled" to another element, it may be directly coupled to the element or electrically coupled thereto with other elements interposed therebetween. It will be further understood that the terms "comprises," "comprising," "includes," and "including" when used in this specification, specify the presence of the stated elements and do not preclude the presence or addition of one or more other elements. The terminology used herein is for the purpose of describing particular embodiments only and is not intended to be limiting. As used herein, singular forms are intended to include the plural forms as well.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

FIG. 1A is a diagram illustrating a single-ended signal generator for outputting a typical single-ended signal.

As shown in FIG. 1A, the single-ended signal generator includes a single-ended signal generation block 110 configured to generate a single-ended current-type signal, and a resistive load block 120 configured to convert the single-ended current-type signal into a voltage-type signal before the single-ended signal is outputted.

Figure 1B:
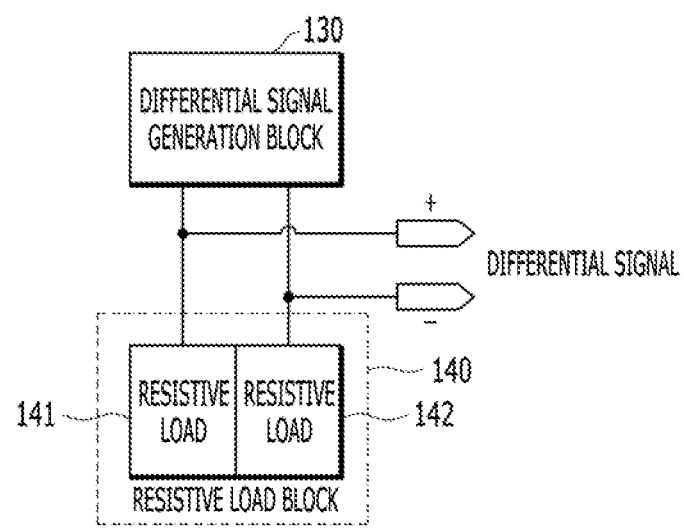
FIG. 1B is a diagram illustrating an exemplary differential signal generator.

FIG. 1B is a diagram illustrating a differential signal generator, including a current-voltage conversion type circuit for outputting differential signals with opposite signal phases having a common voltage noise, or variation.

As shown in FIG. 1B, the differential signal generator includes a differential signal generation block 130 configured to generate current-type differential signals with opposite signal phases including common voltage noise, or variation, and a resistive load block 140 configured to convert the current-type differential signals into voltage-type signals.

Figure 2A:
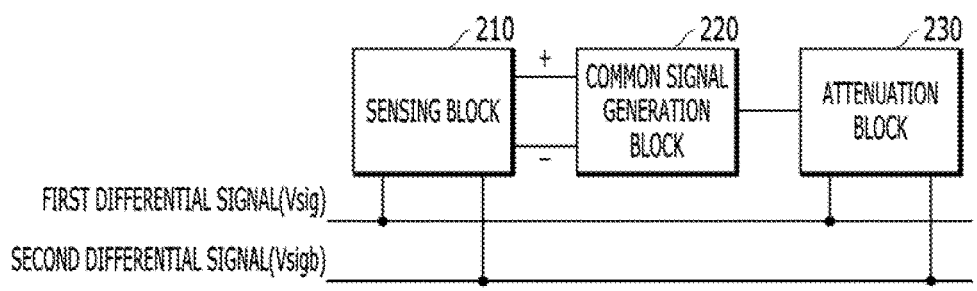
FIG. 2A is a diagram illustrating a common signal attenuation circuit in accordance with an embodiment of the present invention.

The resistive load block 140 may include two resistive loads 141 and 142 for converting the respective current-type differential signals into voltage-type signals. The resistive loads may be implemented by using one or more resistors or MOS transistors. For example, a current digital-to-analog converter IDAC or the like may be used as the differential signal generation block 130. In another example, the differential signal generation block 130 may be embodied to generate voltage-type differential signals rather than the current-type differential signals. FIG. 2A is a diagram illustrating a common signal attenuation circuit in accordance with an embodiment of the present invention.

As shown in FIG. 2A, the common signal attenuation circuit may include a sensing block 210 configured to sense differential signals, a common signal generation block 220 configured to combine the sensed differential signals and generate a common signal having a common voltage noise, and an attenuation block 230 configured to receive the common signal having the common voltage noise and attenuate or reduce the common voltage noise in the common signal, thereby allowing the differential signals to have a reduced common voltage noise.

More specifically, the sensing block 210 senses first and second differential signals Vsig and Vsigb outputted from the differential signal generator 130 of FIG. 1B. The first and second differential signals Vsig and Vsigb have opposite signal phases. The first and second differential signals Vsig and Vsigb may be voltage-type or current-type differential signals. In an embodiment, the sensed differential signals may be of current-type and the sensing block 210 may sense differential signals in a current form.

The common signal generation block 220 may then combine the differential signals sensed by the sensing block 210 and generate an opposite-phase common signal having a common noise or a common voltage noise. Since the common signal generation block 220 combines the first and second differential signals, for example, current-type differential signals, sensed by the sensing block 210, the opposite-phase common signal is generated in such a way that differential components of the two differential signals are removed and only a common component (e.g., common voltage noise) is doubled in the opposite phase.

The attenuation block 230 amplifies or attenuates the opposite-phase common signal and transmits it to a differential signal output terminal, through which the first and second differential signals are outputted, so that the common signal included in the differential signals is attenuated. For example, the opposite-phase common signal, which is of current-type and transmitted to the differential signal output terminal, may be combined with differential signals of current-type and changed into a voltage form again by the resistive load 140 of FIG. 1B, which is coupled to the differential signal output terminal.

As such, the common signal attenuation circuit in accordance with the described embodiment may receive first and second differential signals with opposite signal phases including a common voltage noise, may sense the elementary differential signals in a current form, may generate an opposite-phase common signal having a phase opposite to the common signal such as the common voltage noise included in the differential signals, and may combine the opposite-phase common signal to the differential signals, thereby attenuating the common voltage error in the differential signals.

Figure 2B:
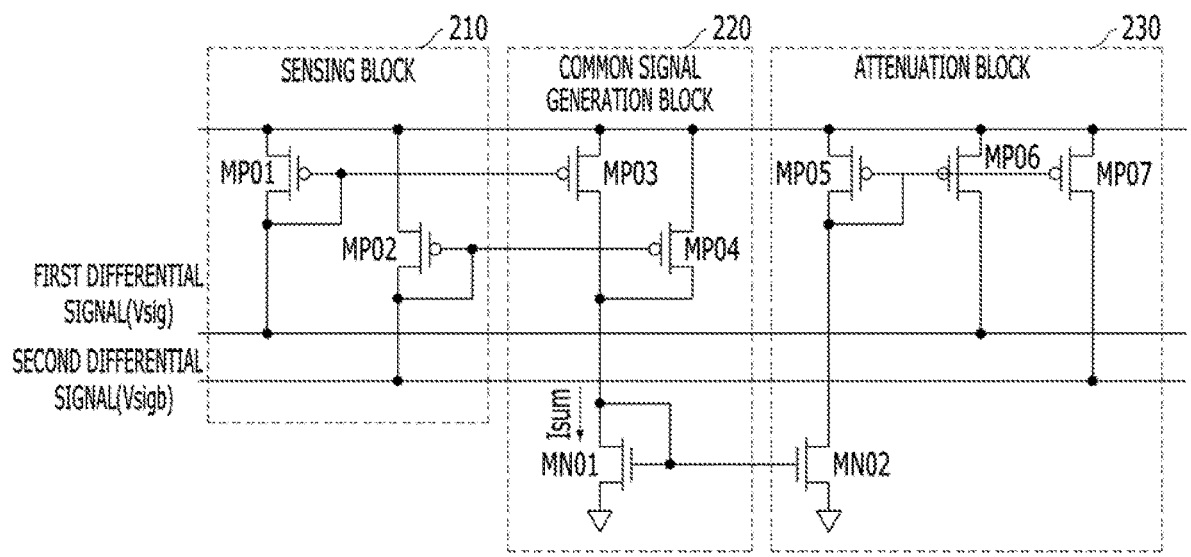
FIG. 2B is a diagram illustrating an exemplary detailed circuit configuration of the common signal attenuation circuit of FIG. 2A.

FIG. 2B is a diagram illustrating an exemplary circuit for the common signal attenuation circuit of FIG. 2A, in accordance with an embodiment of the present invention.

As shown in FIG. 2B, the sensing block 210 includes a first PMOS transistor MP01 configured to sense, in a current form, a first differential signal outputted from the differential signal generation block 130, and a second PMOS transistor MP02 configured to sense, in a current form, a second differential signal having an opposite signal phase to the first differential signal and outputted from the differential signal generation block 130.

The first PMOS transistor MP01 may include a source to which a power supply (not shown) is applied, a drain into which the first differential signal is inputted, and a gate which is coupled with the drain to form a diode connection. The second PMOS transistor MP02 may include a source to which the power supply is applied, a drain into which the second differential signal is inputted, and a gate which is coupled with the drain to form a diode connection.

The common signal generation block 220 includes a third PMOS transistor MP03 configured to transmit the first current-type differential signal sensed by the first PMOS transistor MP01, a fourth PMOS transistor MP04 configured to transmit the second current-type differential signal sensed by the second PMOS transistor MP02, and a first NMOS transistor MN01 configured to generate the opposite-phase common signal by combining the first current-type differential signal received from the third PMOS transistor MP03 with the second current-type differential signal received from the fourth PMOS transistor MP04. As such, as the first and second current-type differential signals are combined with each other, the opposite-phase common signal is generated by removing differential components of the first and second current-type differential signals and doubling only a common component thereof in the opposite phase.

The third PMOS transistor MP03 may include a source to which the power supply is applied, a drain coupled to a drain of the first NMOS transistor MN01, and a gate to which the first current-type differential signal is applied from the gate of the first PMOS transistor MP01. The third PMOS transistor MP03 may be operated according to the first current-type differential signal. The fourth PMOS transistor MP04 may include a source to which the power supply is applied, a drain coupled to the drain of the first NMOS transistor MN01, and a gate to which the second current-type differential signal is applied from the gate of the second PMOS transistor MP02. The fourth PMOS transistor MP04 may be operated according to the second current-type differential signal. The first NMOS transistor MN01 may include a source coupled to the ground, a drain which receives the first current-type differential signal from the drain of the third PMOS transistor MP03 and the second current-type differential signal from the drain of the fourth PMOS transistor MP04, and a gate which is coupled with the drain to form diode connection.

The attenuation block 230 includes a second NMOS transistor MN02 configured to amplify or attenuate the opposite-phase common signal generated from the first NMOS transistor MN01, a fifth PMOS transistor MP05 configured to transfer the opposite-phase common signal having the common voltage noise from the second NMOS transistor MN02, a sixth PMOS transistor MP06 configured to amplify or attenuate the opposite-phase common signal transferred from the fifth PMOS transistor MP05 to generate a first opposite-phase common signal and provide the first opposite-phase common signal to a first differential signal output terminal, through which the first differential signal is outputted, so that the original common signal included in the first current-type differential signal is attenuated, and a seventh PMOS transistor MP07 configured to amplify or attenuate the opposite-phase common signal transferred from the fifth PMOS transistor MP05 to generate a second opposite-phase common signal and provide the second opposite-phase common signal to a second differential signal output terminal, through which the second differential signal is outputted, so that the original common signal included in the second current-type differential signal is attenuated. Here, the amplifying or attenuating of the opposite-phase common signal may be appropriately embodied using a current mirror scheme.

The second NMOS transistor MN02 may include a source coupled to the ground, a drain coupled to a drain of the fifth PMOS transistor MP05, and a gate to which the opposite-phase common signal is applied from the gate of the first NMOS transistor MN01. The second NMOS transistor MN02 may be operated according to the opposite-phase common signal applied to the gate. The fifth PMOS transistor MP05 may include a source to which the power supply is applied, a drain coupled with the drain of the second NMOS transistor MN02, and a gate which is coupled with the drain to form a diode connection. The sixth PMOS transistor MP06 may include a source to which the power supply is applied, a drain coupled to the first differential signal output terminal, and a gate to which the opposite-phase common signal is applied from the gate of the fifth PMOS transistor MP05. The sixth PMOS transistor MP06 may be operated according to the opposite-phase common signal applied to the gate. The seventh PMOS transistor MP07 may include a source to which the power supply is applied, a drain coupled to the second differential signal output terminal, and a gate to which the opposite-phase common signal is applied from the gate of the fifth PMOS transistor MP05. The seventh PMOS transistor MP07 may be operated according to the opposite-phase common signal applied to the gate.

Figure 2C:
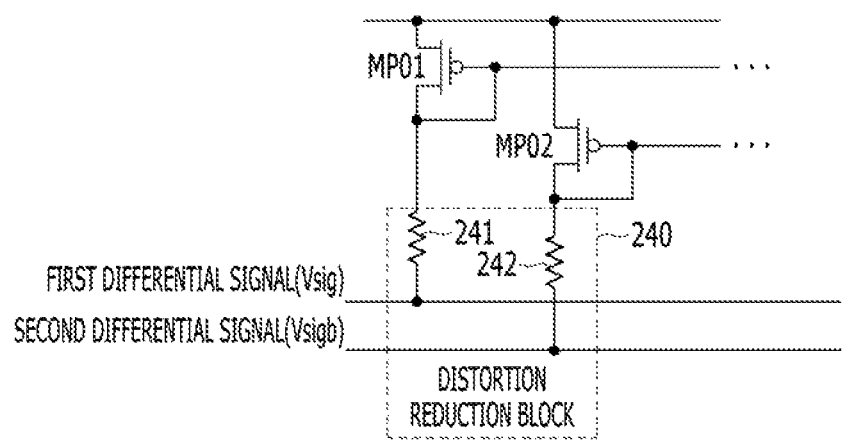
FIG. 2C is a diagram illustrating another exemplary detailed circuit configuration of the common signal attenuation circuit of FIG. 2A.

FIG. 2C illustrates a distortion reduction block 240 included in the common signal attenuation circuit of FIG. 2A.

As shown in FIG. 2C, the common signal attenuation circuit of FIG. 2 may further include the distortion reduction block 240 between the sensing block 210 and the differential signal output terminals for reducing distortion of the differential signals and transmitting the noise-reduced differential signals to the sensing block 210.

The distortion reduction block 240 may provide the distortion-reduced differential signals to the sensing block 210 so that the sensing block 210 can clearly sense the differential signals.

The distortion reduction block 240 may first reduce distortion of the differential signals outputted from the differential signal generation block 130 and then transmit the distortion-reduced differential signals to the sensing block 210. The distortion reduction block 240 includes a first impedance unit configured to reduce distortion of the first differential signal outputted from the differential signal generation block 130 and transmitting the distortion-reduced first differential signal to the first PMOS transistor MP01, and a second impedance unit configured to reduce distortion of the second differential signal outputted from the differential signal generation block 130 and transmit the distortion-reduced second differential signal to the second PMOS transistor MP02. As shown in FIG. 2C, the first impedance unit is embodied by a first resistance 241, and the second impedance unit may be embodied by a second resistance 242. Alternatively, each of the first and second impedance units may be embodied using a resistance and capacitor.

In addition, the distortion reduction block 240 may be embodied with a buffer (e.g., a source follow buffer) to minimize distortion of the differential signals.

Figure 3:
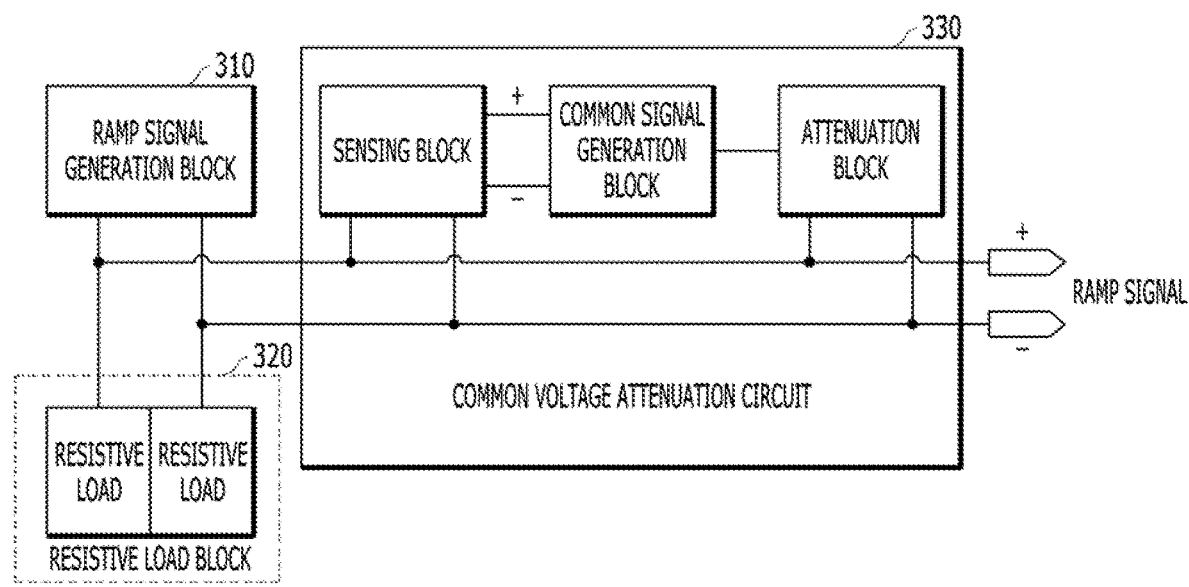
FIG. 3 is a diagram illustrating a ramp signal generator including a common signal attenuation circuit in accordance with an embodiment of the present invention.

FIG. 3 is a diagram illustrating a ramp signal generator including the common signal attenuation circuit of FIG. 2A.

As shown in FIG. 3, the ramp signal generator includes a ramp signal generation block 310 configured to generate two ramp signals having opposite signal phases and including a common signal, a common signal attenuation circuit 330 configured to attenuate the common signal of the two ramp signals by generating an opposite-phase common signal from the two ramp signals and attenuating the original common signal from the two ramp signals through the opposite-phase common signal, and a resistive load block 320 configured to convert the two current-type ramp signals, the common signal of which has been attenuated by the common signal attenuation circuit 330, into two voltage-type ramp signals before the two ramp signals are outputted. The common signal attenuation circuit 330 may correspond to the common signal attenuation circuit described with reference to FIGS. 2A to 2C, and the ramp signal generation block 310 and the resistive load block 320 may respectively correspond to the differential signal generation block 130 and the resistive load block 140 described with reference to FIG. 1B.

In accordance with an embodiment, a common signal attenuation circuit may sense differential signals including a common signal, generate an opposite-phase common signal using the sensed differential signals, and attenuate the original common signal of the differential signals by combining the opposite-phase common signal to the differential signals including the original common signal. Thereby, variation of common voltage may be reduced.

In accordance with an embodiment, the common signal attenuation circuit is operated without an amplifier. Therefore, the area of the circuit may be reduced, and the power consumption thereof may be reduced.

In accordance with an embodiment, common voltage noise or glitch which is caused in the differential signals may be reduced, whereby the performance of an analog circuit may be enhanced.

Although various embodiments have been described for illustrative purposes, it will be apparent to those skilled in the art that various changes and modifications may be made without departing from the spirit and scope of the disclosure as defined in the following claims.

What is claimed is:
1. A common signal attenuation circuit comprising:
   a sensing block suitable for sensing differential signals;
   a common signal generation block suitable for summing the differential signals, which are sensed by the sensing block, and generating a common signal having a common voltage noise, wherein the differential signals include first and second differential signals having opposite phases to each other, and differential components of the first and second differential signals are removed and the common voltage noise of the first and second differential signals is doubled in the opposite phases; and an attenuation block suitable for adjusting the common voltage noise included in the common signal by combining the common signal having the adjusted common voltage noise to the differential signals, wherein the differential signals are of current-type, and wherein the common signal generation block comprises:

a third PMOS transistor suitable for transmitting the first current-type differential signal sensed by the sensing block;

a fourth PMOS transistor suitable for transmitting the second current-type differential signal sensed by the sensing block; and a first NMOS transistor suitable for generating the common signal having a common voltage noise by combining the first current-type differential signal and the second current-type differential signal with each other.

2. The common signal attenuation circuit of claim 1, further comprising a distortion reduction block suitable for reducing distortion of the differential signals and providing the distortion-reduced differential signals to the sensing block.

3. The common signal attenuation circuit of claim 2, wherein the distortion attenuation block comprises:

a first impedance unit suitable for reducing distortion of the first differential signal and providing the distortion-reduced first differential signal to the sensing block; and a second impedance unit suitable for reducing distortion of the second differential signal and providing the distortion-reduced second differential signal to the sensing block.

4. The common signal attenuation circuit of claim 2, wherein the distortion reduction block includes a buffer.

5. The common signal attenuation circuit of claim 1, wherein the differential signals include current-type differential signals.

6. The common signal attenuation circuit of claim 1, wherein the attenuation block amplifies or attenuates the common voltage noise in the common signal and combines the amplified or attenuated common signal to the differential signals thereby attenuating the common voltage noise of the differential signals.

7. The common signal attenuation circuit of claim 1, wherein the sensing block comprises:

a first PMOS transistor suitable for sensing, in a current form, the first differential signal; and a second PMOS transistor suitable for sensing, in a current form, the second differential signal.

8. The common signal attenuation circuit of claim 1, wherein the attenuation block comprises:

a second NMOS transistor suitable for amplifying or attenuating and transmitting the common signal having the common voltage noise generated from the common signal generation block;

a fifth PMOS transistor suitable for transmitting the opposite-phase common signal from the second NMOS transistor;

a sixth PMOS transistor suitable for amplifying or attenuating the common voltage noise in the common signal provided from the fifth PMOS transistor to generate a common signal having the amplified or attenuated common voltage noise and combining the common signal to the first differential signal so that the common voltage noise included in the first differential signal is attenuated; and a seventh PMOS transistor suitable for amplifying or attenuating the opposite-phase common signal provided from the fifth PMOS transistor to generate the common signal having the amplified or attenuated common voltage noise and combining the common signal to the second differential signal so that the common voltage noise included in the second differential signal is attenuated.

9. A ramp signal generator comprising:

a ramp signal generation block suitable for generating two ramp signals having opposite signal phases and including a common voltage nose;

a common signal attenuation circuit suitable for summing the two ramp signals, generating a common signal having the common voltage noise from the ramp signals and attenuating the common voltage noise in the common signal based on the two ramp signals; and a resistive load block suitable for converting the ramp signals including the attenuated common voltage noise into voltage-type ramp signals, wherein the ramp signals include first and second ramp signals having opposite phases to each other, and wherein differential components of the first and second ramp signals are removed and the common voltage noise of the first and second ramp signals is doubled in the opposite phases, wherein the common signal attenuation circuit comprises:

a sensing block suitable for sensing the ramp signals;

a common signal generation block suitable for summing the ramp signals sensed by the sensing block with each other and generating the common signal having the common voltage noise; and an attenuation block suitable for attenuating the common voltage noise by combining the common signal to the ramp signals, wherein the ramp signals are of current-type, and wherein the common signal generation block comprises:

a third PMOS transistor suitable for transmitting the first current-typed ramp signal sensed by the sensing block;

a fourth PMOS transistor suitable for transmitting the second current-typed ramp signal sensed by the sensing block; and a first NMOS transistor suitable for generating the common signal having the common voltage noise by combining the first current-typed ramp signal and the second current-typed ramp signal with each other.

10. The ramp signal generator of claim 9, further comprising a distortion reduction block suitable for reducing distortion of the ramp signals and providing the distortion-reduced ramp signals to the sensing block.

11. The ramp signal generator of claim 10, wherein the distortion attenuation block comprises:

a first impedance unit suitable for reducing distortion of the first ramp signal and providing the distortion-reduced first ramp signal to the sensing block; and a second impedance unit suitable for reducing distortion of the second ramp signal and providing the distortion-reduced second ramp signal to the sensing block.

12. The ramp signal generator of claim 9, wherein the ramp signals are of current-type.

13. The ramp signal generator of claim 9, wherein the attenuation block amplifies or attenuates the opposite-phase common signal and combines the amplified or attenuated opposite-phase common signal to the ramp signals thereby attenuating the common signal of the ramp signals.

14. The ramp signal generator of claim 9, wherein the sensing block senses a ramp signal in a current form.

15. The ramp signal generator of claim 9,
wherein the sensing block comprises:
a first PMOS transistor suitable for sensing, in a current form, the first ramp signal; and
a second PMOS transistor suitable for sensing, in a current form, the second ramp signal.

16. The ramp signal generator of claim 9,
wherein the ramp signals are of current-type, and
wherein the attenuation block comprises:
a second NMOS transistor suitable for amplifying or attenuating the common voltage noise and transmitting the common signal having the amplified or attenuated common voltage noise and generated from the common signal generation block;
a fifth PMOS transistor suitable for transmitting the common signal from the second NMOS transistor;
a sixth PMOS transistor suitable for amplifying or attenuating the common voltage noise in the common signal provided from the fifth PMOS transistor to generate a first common signal having the amplified or attenuated common voltage noise and combining the first common signal to the first ramp signal so that the common voltage noise included in the first ramp signal is attenuated; and
a seventh PMOS transistor suitable for amplifying or attenuating the opposite-phase common signal provided from the fifth PMOS transistor to generate a second common signal having the amplified or attenuated common voltage noise and combining the second common signal having the amplified or attenuated common voltage noise to the second ramp signal so that the common signal included in the second ramp signal is attenuated.

* * * * *